United States Patent [19]
Bryson et al.

[11] Patent Number: 5,842,155
[45] Date of Patent: Nov. 24, 1998

[54] METHOD AND APPARATUS FOR ADJUSTING PIN DRIVER CHARGING AND DISCHARGING CURRENT

[75] Inventors: Stephen W. Bryson; Alan T. Kondo, both of Cupertino; Don N. Lee, San Jose, all of Calif.

[73] Assignee: Fairchild Semiconductor Corp., So. Portland, Me.

[21] Appl. No.: 56,094

[22] Filed: May 3, 1993

[51] Int. Cl.$^6$ .................................................. G01R 31/02
[52] U.S. Cl. ..................... 702/124; 324/73.1; 371/27.1
[58] Field of Search ..................... 324/73.1, 523; 364/579, 580; 371/1, 22.1, 25.1, 27, 27.1, 27.7; 702/108, 117, 124

[56] References Cited

U.S. PATENT DOCUMENTS

| | | | |
|---|---|---|---|
| Re. 31,056 | 10/1982 | Chau et al. .................................. | 371/1 |
| 4,070,565 | 1/1978 | Borrelli ................................ | 364/580 X |
| 4,439,858 | 3/1984 | Petersen ................................ | 371/27 X |
| 4,500,993 | 2/1985 | Jacobson ............................... | 371/27 X |
| 4,583,223 | 4/1986 | Inoue et al. ......................... | 324/73.1 X |
| 4,635,259 | 1/1987 | Schinabeck et al. ............... | 364/579 X |
| 4,637,020 | 1/1987 | Schinabeck ......................... | 371/221 X |
| 4,646,299 | 2/1987 | Schinabeck et al. .............. | 324/73.1 X |
| 4,724,378 | 2/1988 | Murray et al. ......................... | 371/27 |
| 4,837,502 | 6/1989 | Ugenti ................................. | 324/523 X |
| 5,202,639 | 4/1993 | McKeon et al. ......................... | 324/537 |
| 5,377,202 | 12/1994 | Bryson et al. ......................... | 371/27.3 |

*Primary Examiner*—Edward R. Cosimano
*Attorney, Agent, or Firm*—Pierce Atwood

[57] ABSTRACT

A method and apparatus for adjusting charging and discharging currents of a pin driver to optimize slew rates and overshoot for different types of logic circuits. The current charging and discharging circuits include respective transistors that are mirrored to a transistor whose current varies in accordance with VH-VL where VH and VL are programmed reference voltages defining the high and low voltage levels of the output driver pulses. Thus, when VH-VL is relatively large such as for CMOS outputs, slew rates are relatively high. However, when VH-VL is relatively small such as for ECL outputs, slew rates are reduced to prevent excessive overshoot.

20 Claims, 3 Drawing Sheets

METHOD AND APPARATUS FOR ADJUSTING PIN DRIVER CHARGING AND DISCHARGING CURRENT

BACKGROUND OF THE INVENTION

The field of the invention generally relates to test equipment pin drivers, and more particularly relates to adjusting pin driver charging and discharging currents to optimize slew rates and overshoot for different types of driver pulses having different logic levels.

As is well known, the role of a pin driver in typical automatic test equipment (ATE) systems is to send driver pulses having the correct voltages and timing to a device under test (DUT). A prototype pin driver was built to include a pulse forming section, a buffer, and an amplifier connected in series. A data input to the pulse forming section controlled the state of a differential pair of transistors. The collector of a first one of the transistors was connected to an output node clamped to a voltage range by diodes connected with opposite polarity. The collector of this transistor was also connected through a current charging transistor to a first current source. The emitter of the first transistor of the differential pair was connected to a current source to sink current from the node depending of the state of the differential pair. When the data input was high, the first one of the differential pair of transistors was turned off, and the node was charged by 5 milliamps flowing from the charging transistor. However, when the data input was low, the first one of the differential pair of transistors was turned on. Under this condition, the emitter current source would sink 10 milliamps of current; 5 milliamps was drawn from the charging transistor, and 5 milliamps was used to discharge the node.

Two important parameters of a pin driver are slew rate and overshoot. Here, slew rate is defined as 60% (VOH-VOL) /$T_R$ where VOH and VOL are high and low level voltages of an output pulse, and $T_R$ is the rise time. In particular, slew rate is the rate of change of voltage at the output terminal, and is determined by the rise time between 20% (VOH-VOL) and 80% (VOH-VOL). Overshoot is the amount by which the first maximum occurring in the pulse-top waveform exceeds VOH. Negative overshoot is the amount of overshoot in the negative going direction at the end of a pulse below VOL. Generally, pin drivers must have output pulses with rise and fall times that are faster than the highest speed of devices under test. This may result in small signal rise times of less than 700 picoseconds and large signal slew rates of over 2.0 volts/nanosecond. These specifications are typically with the pin driver loaded with 15 inches or more of 50 ohm line. At repetition rates above 100 MHz, the driver sees a load of approximately 100 ohms which includes the termination resistance plus the impedance of the line. For a 5.0V peak to peak output, the driver must supply at least 50 milliamps. Most ATE systems require the pin drivers to have 100 milliamps maximum output current capability.

In designing pin drivers, there is a trade off between slew rate and overshoot. High slew rates become critical for CMOS outputs, and low overshoot becomes critical for ECL outputs. In particular, in CMOS circuits, the logical "1" or high level approaches the power supply level, usually 5 volts, while the logical "0" or low level often refers to the ground potential, 0 volts. In order to have fast CMOS outputs, relatively large charging and discharging currents must be used in the pulse forming section to overcome parasitic capacitance. However, relatively large charging currents may be too large for ECL outputs, thus causing excessive overshoot and other forms of ringing in the output waveform. In particular, an ECL logical "1" or high level approaches −0.8 volt, while the logical "0" or low level approaches −1.7 volts. That is, the differential for logic levels in ECL is less than CMOS, and overshoot caused by relatively large charging and discharging currents is more critical. Stated differently, the problem of overshoot is magnified with ECL outputs because the signal amplitude is much smaller, while the aberration amplitude remains constant. As a result, the ratio of the aberration amplitude to output amplitudes is much larger at ECL logic levels than at CMOS levels. ATE systems may typically specify drive waveform aberrations to be less than 5% at the DUT. Therefore, overshoot becomes a more critical parameter when testing ECL logic devices.

SUMMARY OF THE INVENTION

In accordance with the invention, a circuit comprises a pulse forming means responsive to a data input signal for providing a pulsed output to an output node in accordance with the data input signal, the pulse forming means comprising means for providing charging currents to and discharging currents from the node, and means for adjusting the charging and discharging currents of the pulse forming means in accordance with high and low reference voltages. It is preferable that the circuit further comprise an output amplifier responsive to the pulsed output of the pulse forming means for providing driver pulses adapted to be fed to a device under test. It is also preferable that the circuit comprises means for clamping the node to a range between upper and lower voltages in response to the high and low reference voltages. It is also preferable that the adjusting means comprises a first transistor for providing charging current to the node and a second transistor for discharging current from the node. It is further preferable that the adjusting means comprises a difference amplifier fed by the high and low reference voltages, and means responsive to an output of the difference amplifier for producing a current in accordance with the difference between the high and low reference voltages wherein the first and second transistors have respective terminals connected to mirror current in response to the current producing means.

The invention may also the practiced by a method of compensating test equipment adapted to provide driver pulses to a pin of a device under test to permit slew rates and overshoots to be optimized for a plurality of different types of test devices having different logic circuit types operating at different logic voltage levels, the method comprising the steps of providing charging currents to and discharging currents from a node to form pulses timed in accordance with input data signal, and adjusting the magnitude of the charging and discharging currents in response to selected high and low reference voltages that determine the high and low voltage levels of the driver pulses. In effect, the charging and discharging currents automatically track the output amplitudes to optimize slew rates and overshoots for the selected voltage levels of the driver pulses.

With such arrangement, the magnitudes of the charging and discharging currents are automatically compensated in accordance with the differential between the logic voltage levels. For example, when a CMOS circuit is being tested and the pulse logic levels are, for example, 5 volts and 0 volts for a voltage differential of 5 volts, the charging and discharging currents will be relatively large. Therefore, the slew rates will be relatively high. That is, because the charging and discharging currents are relatively large, the rise and fall times will be relatively fast. In contrast, when an ECL circuit having logic voltage levels of, for example, −0.8 and −1.7 is being tested, the differential voltage of 0.9 volts causes the charging and discharging currents to be automatically reduced from the levels used with a CMOS device. Therefore, the overshoot is correspondingly reduced. Thus, there is an automatic tradeoff between high slew rates and small overshoots to optimize for circuits of different logic types in response to the differential between the high and low logic levels of a device under test.

BRIEF DESCRIPTION OF THE DRAWINGS

The foregoing objects and advantages will be more fully understood by reading the following description of the preferred embodiment with reference to the drawings wherein.

DESCRIPTION OF THE PREFERRED EMBODIMENT

Figure 1:
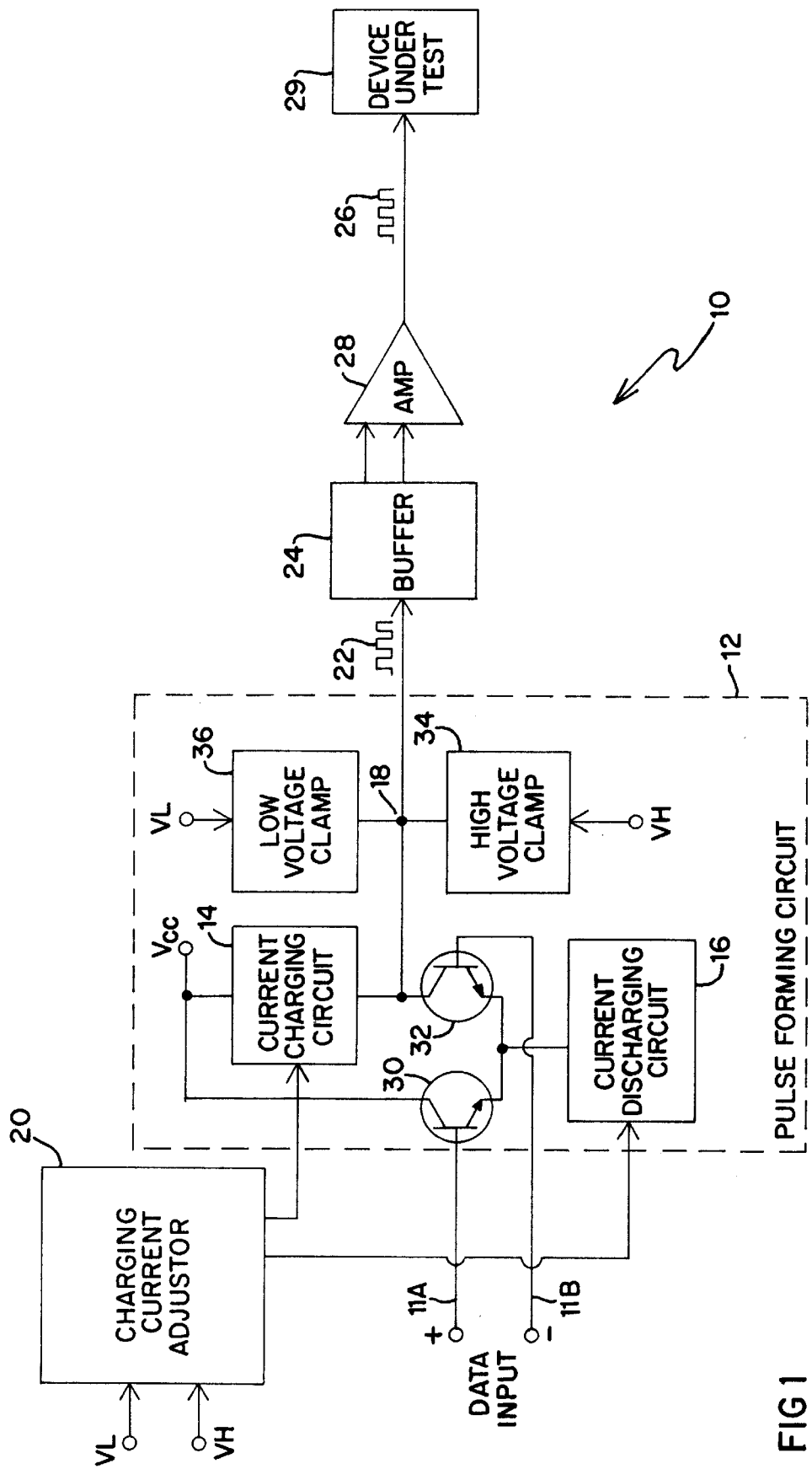
FIG. 1 is a simplified block diagram of a pin driver in accordance with the invention.

In accordance with the invention, a circuit such as pin driver 10 includes a pulse forming circuit 12 that is responsive to a data input signal on lines 11a and 11b for providing a pulsed output to an output node 18 in accordance with the data input signal. The pulse forming circuit 12 includes a current charging circuit 14 for providing charging current to node 18, and also a current discharging circuit 16 for discharging current from node 18. The circuit 10 further includes charging current adjuster 20 that is responsive to high and low reference voltages VH and VL for adjusting the current charging circuit 14 and current discharging circuit 16. Therefore, in accordance with the invention, the charging and discharging currents of the pulse forming circuit 12 are adjusted in response to the differential between the high and low pulse levels in order to optimize slew rate and overshoot for the particular circuit logic type being used.

Referring now to FIG. 1, the data input has complementary states that are provided in conventional manner, and input to pulse forming circuit 12 on lines 11a and 11b. For example, the complementary states of the input data may switch at a rate of 100 MHz. In response thereto, pulse forming circuit 12 generates or forms pulses 22 that are timed in accordance with the data input. That is, the delay, width, and period of pulses 22 from pulse forming circuit 12 are determined by the timing of data input pulses. The high and low voltages of pulses 22 are clamped in response to high and low programmed reference voltages VH and VL at node 18 in a manner to be described, and then the pulses are coupled to buffer 24. Buffer 24 functions to keep the parameters of output driver pulses 26 independent of the load. More specifically, amplifier 28 requires a significant amount of input bias current; therefore, without buffer 24, the slew rate of the pulse forming circuit 12 output signal would be dependent upon the loading on the output of amplifier 28. Complementary outputs of buffer 24 are coupled to amplifier 28 that provides the drive for driver pulses 26 to a device under test 29.

Still referring to FIG. 1, the data input lines 11a and 11b are connected to the respective bases of transistors 30 and 32 as shown. The collector of transistor 32 is connected to node 18, and also to current charging circuit 14. The emitters of transistors 30 and 32 are connected in common, and also coupled to the current discharging circuit 16. The collector of transistor 30 is connected to $V_{cc}$. In operation, when the data input on line 11a is high, the complementary value is coupled to the base of transistor 32 turning it off. In this condition, current flows from current charging circuit 14 to charge node 18. When the voltage at node 18 reaches the value set by high voltage clamp 34, the voltage is clamped. When the data input line 11a goes low, the complementary value on the base of transistor 32 turns it on, and current discharging unit 16 sinks current from node 18. More specifically, the current discharging circuit 16 sinks current at twice the value of current charging circuit 14, so half the current comes from current charging circuit 14, and the other half comes from node 18. That is, the charging and discharging currents for node 18 are equal to keep the positive and negative slew rates equal. When the voltage at node 18 reaches the clamping voltage of low voltage clamp 36, it is clamped there. The low voltage reference VL defines the lower level of driver pulses 26, and the high voltage reference VH defines the high value of driver pulses 26.

In accordance with the invention, the high and low reference voltages VH and VL are also coupled to charging current adjuster 20. In response thereto, charging current adjuster 20 adjusts the values of charging current from current charging circuit 14 and also the discharging current drawn by current discharging circuit 16. In particular, the charging currents from and discharging currents to circuits 14 and 16 are held at the same 1:2 ratio, and are adjusted upwardly or downwardly as a function of or in proportion to the voltage differential between VL and VH. Therefore, if there is a large differential between the logic levels of a device under test, the charging and discharging currents are relatively large to provide desirable high slew rates. Conversely, if the differential between high and low logic levels is relatively small, the charging and discharging currents are made relatively small to minimize overshoot. Thus, a trade-off is provided to optimize slew rate and overshoot for the particular device under test.

Figure 2:
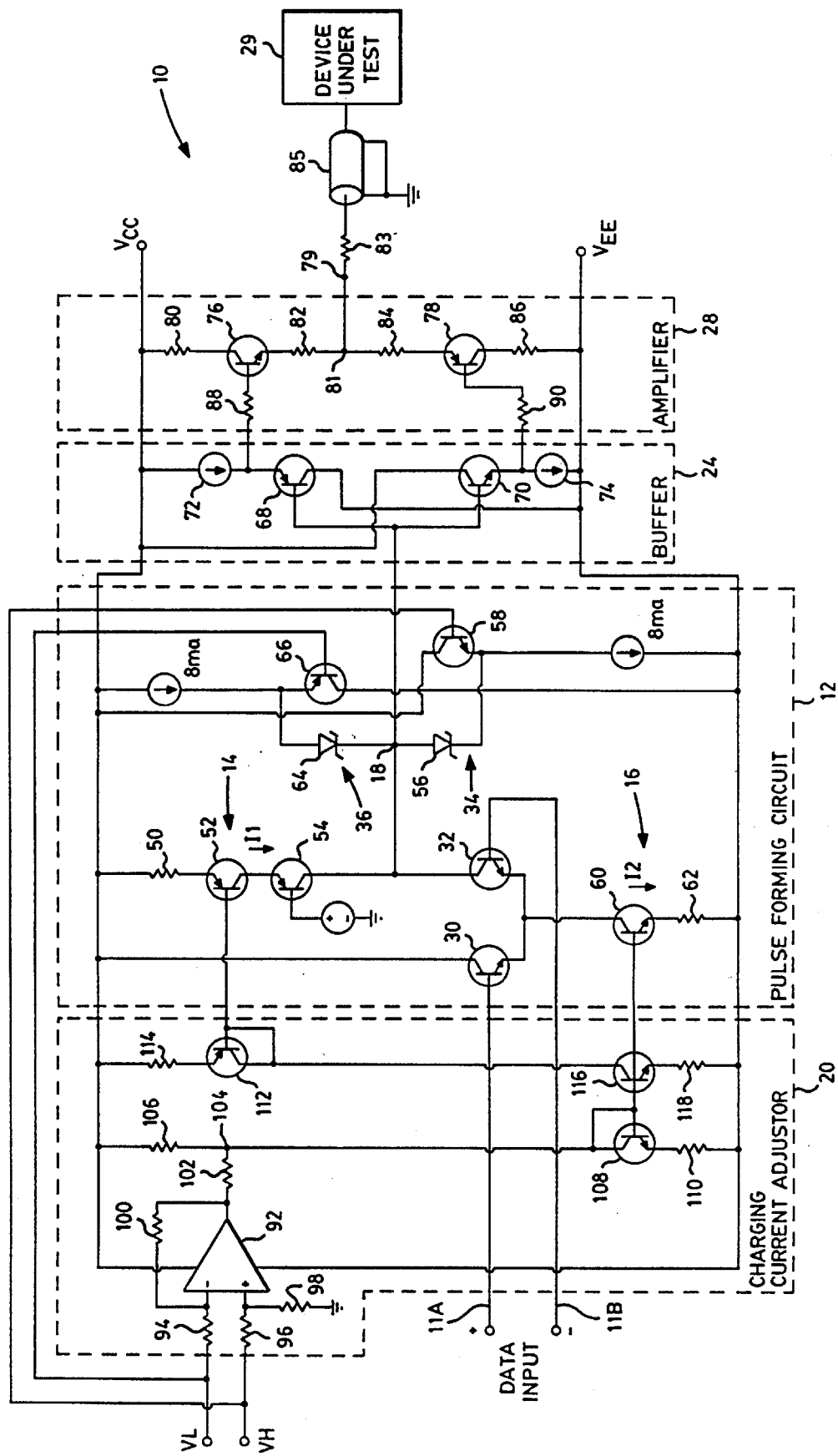
FIG. 2 is a simplified circuit implementation of the pin driver of FIG. 1.

Referring to FIG. 2, a simplified circuit implementation of a pin driver 10 of FIG. 1 is shown. The data input on lines 11a and 11b are connected to the respective bases of transistors 30 and 32 as described with reference to FIG. 1. When the data input signal on line 11a is high providing a low input on line 11b to the base of transistor 32, transistor 32 is turned off. In this state, node 18 is positively charged by current I1 flowing from current charging circuit 14 which includes resistor 50, transistor 52 and transistor 54. When the voltage at node 18 exceeds VH, Schottky diode 56 becomes forward biased and clamps the node 18 to VH plus the diode drop. The reference level VH is buffered by emitter follower transistor 58, which also assists in compensating for the voltage drop of diode 56. The slew rate at which the voltage of node 18 rises is determined by the values of I1 and the node capacitance (Cn) and is equal to:

$$\text{positive slew rate} = I1/Cn$$

With I1 equal to five milliamps and a Cn of two picafarads, the slew rate of the positive edge is approximately 2.5 volts per nanosecond.

When the data input on line 11a goes low thereby providing a high bias on line 11b to the base of transistor 32, transistor 32 turns on. In this state, the collector of transistor 32 sinks current through current discharging circuit 16 which includes transistor 60 and resistor 62 connected from the emitter of transistor 32 to $V_{EE}$. Transistors 52 and 60 and resistors 50 and 62 are selected to provide a discharging current I2 through transistor 60 that is twice the magnitude of I1. For example, if I1 is five milliamps, then I2 is ten milliamps. In the condition with transistor 32 in conduction, five milliamps is taken up by I1, and five milliamps is used to discharge node 18. In short, due to the discharging when transistor 32 is switched on, node 18 starts to decrease linearly with a slew rate that is equal to the positive slew rate. That is, the positive and negative slew rates are equal because the charging and discharging currents to and from node 18 are both the same, and Cn is the same for both output pulse transitions. When the voltage at node 18 decreases to VL, diode 64 becomes forward biased and clamps the node 18 at VL plus the diode drop. Emitter follower transistor 66 buffers VL and also serves to provide compensation for the voltage drop across diode 64.

As a result of clamp diodes 56 and 64, current charging circuit 14, current discharging circuit 16, emitter follower transistors 58 and 66, and the differential pair of transistors 30 and 32, the signal generated by the pulse forming circuit 12 has the voltage levels, polarity, and timing that is required at the output 79 of pin driver 10. However, the output of the pulse forming circuit 12 must be buffered by buffer 24 because the output stage amplifier 28 requires a significant amount of input bias current. Without buffer 24, the slew rate of the output signal of pulse forming circuit 12 would be dependent upon the loading on the output of amplifier 28. This would make the pin driver unacceptable for almost all ATE systems.

To keep the driver signal output parameters independent of the load, the pulse forming circuit 12 output is buffered by buffer 24 which includes transistors 68 and 70 and current sources 72 and 74. In particular, node 18 is coupled to the bases of respective transistors 68 and 70. Current source 72 is connected from $V_{CC}$ to the emitter of transistor 68 and the collector is connected to $V_{EE}$. Current source 74 is connected from $V_{EE}$ to the emitter of transistor 70 and the collector is connected to $V_{cc}$. Thus, transistors 68 and 70 are thus connected as emitter followers that buffer amplifier 28 which includes transistors 76 and 78. In addition, transistors 68 and 70 also provide first order base emitter voltage compensation for transistors 76 and 78, respectively. As a result, the pulse signals progress from pulse forming circuit 12 to pin driver output 79 with very little change in voltage levels, slew rates, and timing.

Amplifier 28 is a complementary emitter follower including transistors 76 and 78. The collector of npn transistor 76 is coupled through resistor 80 to $V_{CC}$, and the emitter is coupled through resistors 82 and 84 to the emitter of pnp transistor 78. The collector of transistor 78 is connected through resistor 86 to $V_{EE}$. The base of transistor 76 receives its bias from the emitter of pnp transistor 68 through resistor 88, and the base of transistor 78 receives its bias from the emitter of npn transistor 70 through resistor 90. Turn on base currents for transistors 76 and 78 are provided by current sources 72 and 74, respectively. Turn off base currents for transistors 76 and 78 are provided by transistors 68 and 70, respectively. The quiescent emitter currents of transistors 76 and 78 are stabilized by resistors 82 and 84.

Amplifier 28 is protected against short circuit loads by the collector resistors 80 and 86, and the emitter resistors 82 and 84. These resistors limit the peak currents in transistors 76 and 78, and also cause the collectors to saturate for currents exceeding 120 milliamps. Excessive base currents for transistors 76 and 78 are prevented by resistor 88 and current source 72, and resistor 90 and current source 74, respectively. In addition to protection provided by the resistors, the pin driver circuit 10 may also have a thermal sensing circuit that monitors the substrate temperature. The current sources 72 and 74 in amplifier 28 are then turned off whenever the temperature exceeds 125° C., and is reapplied when the temperature drops below 120° C.

The output from amplifier 28 is coupled from node 81 between resistors 82 and 84. Node 81 is connected through output series resistor 83 to transmission line 85 which may, for example be 50 ohm coaxial cable. Transmission line 85 transmits driver pulses to a pin of the device under test 29.

In the discussion heretofore, it was assumed that the current charging circuit 14 supplied 5 milliamps of charging current here identified as I1, and current discharging circuit 16 provided current discharging at 10 milliamps here identified as I2. These current values for I1 and I2 may be optimum for a test device 29 having one particular logic type, but they are not optimum for all logic types. In accordance with the invention, charging current adjuster 20 provides bias voltages to respective transistors 52 and 60, and thereby changes or adjusts currents I1 and I2 in accordance with VL and VH. That is, the magnitudes of I1 and I2 are automatically adjusted in accordance with the voltage differential of the logic levels which correspond to the desired driver pulse output levels VL and VH. In particular, VL and VH are inputs to the negative and positive inputs of difference amplifier 92 through respective resistors 94 and 96. The positive input is coupled through resistor 98 to ground and the negative input receives feedback through resistor 100. The output of difference amplifier 92 is connected through resistor 102 to node 104 which is coupled through resistor 106 to $V_{CC}$. Node 104 is also coupled to the collector of diode connected transistor 108. The emitter of transistor 108 is coupled through resistor 110 to $V_{EE}$. With such arrangement, the current $I_{Q108}$ through transistor 108 is determined by the following equation:

$$I_{Q108} \cong \frac{V_{cc} - Vbe_{Q108}}{R_{110} + \frac{R_{106}R_{102}}{R_{106} + R_{102}}} - \frac{[V_{cc} - (VH - VL)R_{100}/R_{94}]R_{106}}{R_{110}(R_{106} + R_{102}) + R_{102}R_{106}}$$

That is, the current through transistor 108 is the sum of the currents through resistors 102 and 106. The current through resistor 106 is the voltage drop divided by the resistance, and the current through 102 is determined by the difference between the output level of amplifier 92 and the voltage at node 104. The voltage at the output of amplifier 92 is equal to the difference between VH and VL multiplied by gain of difference amplifier 92 as defined by the resistance ratio of resistors 94,96,98 and 100.

The above equation shows that the current through transistor 108 is a function of the difference between VH and VL. Therefore, when the differential VH and VL is relatively high, such as for CMOS, the current through transistor 108 will be relatively large. Conversely, when the differential between VH and VL is relatively small such as with ECL, the current through transistor 108 will relatively small.

By suitably selecting the values of resistors 94, 100, 102, and 106, the relationship between the current $I_{Q108}$ through transistor 108 and VH-VL can be made to vary in a desirable manner. That is, as VH-VL is relatively large such as would be the case for CMOS where VH-VL would be approximately 5 volts, $I_{Q108}$, would be relatively large. Conversely, as VH-VL is relatively small such as would be the case with ECL where VH-VL would be approximately 0.9 volt, $I_{Q108}$, would be relatively small.

Transistor 52 of current charging circuit 14 and transistor 60 of current discharging circuit 16 are arranged to mirror the current $I_{Q108}$ flowing through transistor 108. In particular, the bases of transistors 60 and 108 are interconnected. Also, the base of transistor 52 is connected to the base of diode connected transistor 112 which is connected in series with resistor 114, transistor 116 and resistor 118 between $V_{CC}$ and $V_{EE}$, as shown. Further, the base of transistor 116 is interconnected to the base of transistor 108. Thus, as the current $I_{Q108}$ goes up and down as a function of the differential voltage VH-VL being selected or reprogrammed for different logic circuit types, the charging current through transistor 52 and the discharging current through transistor 60 are adjusted accordingly. For example, for one logic circuit type such as CMOS, it may be desirable that the slew rate and overshoot be optimized with I2 to equal to ten milliamps, and I1 equal to five milliamps. Thus, for VH-VL equal to five volts for CMOS, the sizes of the respective transistors and the resistances of the respective resistors are selected to provide this operating characteristic. Then, as VH and VL are reprogrammed to –0.8 volt and –1.7 volts respectively to switch the operating mode to ECL, the values I2 and I1 are correspondingly decreased while maintaining the same 2:1 ratio to provide positive and negative slew rates that are equal. Therefore, the slew rates are decreased, but so are the overshoots thus trading off these performance parameters to optimize for ECL testing. In summary, the charging and discharging currents I1 and I2 are adjusted or tailored such that high slew rates are produced for large output magnitude signals while lower slew rates are provided for small output magnitude signals to minimize overshoot and ringing.

Figure 4:
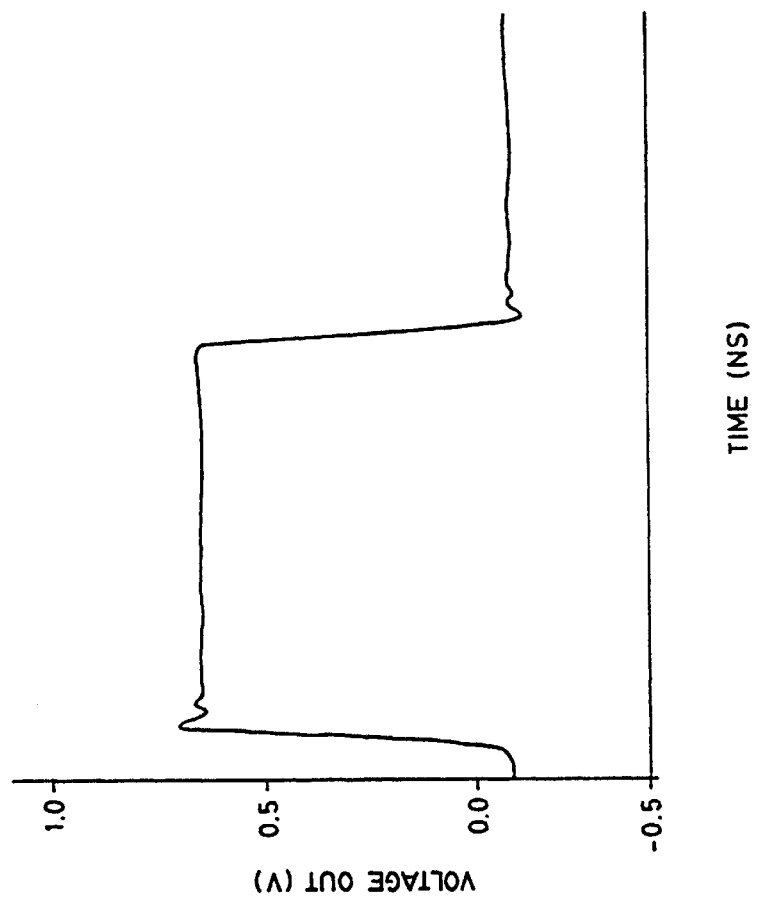
FIG. 4 is a waveform of a pulse with charging and discharging current compensation.
Figure 3:
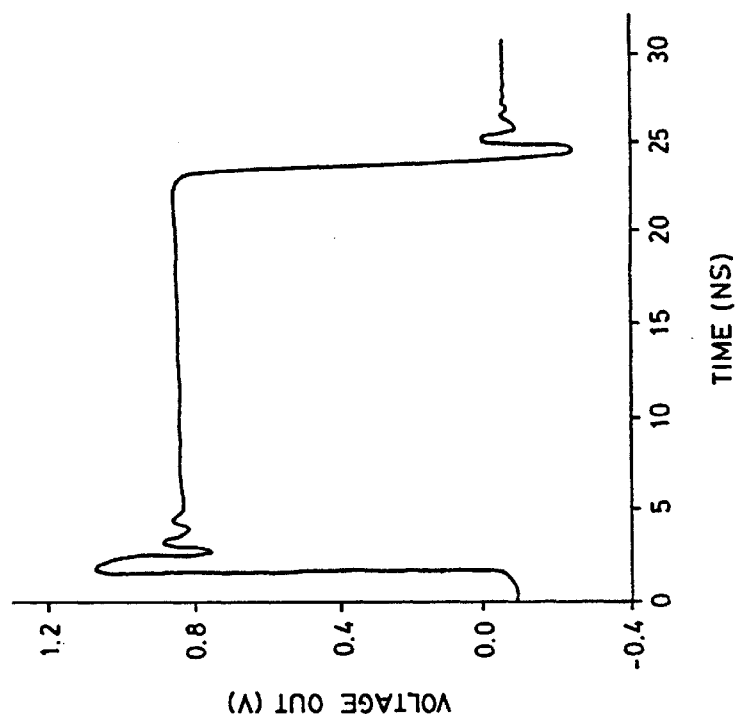
FIG. 3 shows the waveform of a pulse without the charging current compensation.

Referring to FIGS. 3 and 4, the improvement in overshoot for a low differential voltage driver pulse such as for ECL is shown. In particular, FIG. 3 shows an ECL output from a pin driver 10 with fixed charging and discharging currents for all logic circuit types. For example, the same charging and discharging currents I1 and I2 that were used to provide desirable slew rates for CMOS operation were used for ECL outputs. An overshoot of 265 millivolts or 33% was measured. FIG. 4 shows the same output from pin driver 10 in accordance with the invention whereby the charging and discharging currents are adjusted downwardly in response to a reduction in VH-VL. FIG. 4 shows an overshoot of 75 millivolts or 9.4%. Thus, by making charging and discharging currents I1 and I2 mirror transistor 108 current $I_{Q108}$ which is responsive to VH-VL, the slew rates and overshoot are automatically optimized for driver pulses of different logic voltage levels.

This concludes the description of the preferred embodiment. A reading of it by one of skilled in the art will bring to mind many modifications and alterations that do not depart from the spirit and scope of the invention. Therefore, it is intended that the scope of the invention be limited only by the appended claims.

What is claimed is:

1. A circuit comprising:
   pulse forming means responsive to a data input signal for providing a pulsed output to an output node, said pulsed output being timed in accordance with said data input signal and having high and low voltage levels responsive to respective high and low reference voltages, said pulse forming means comprising means for providing charging currents to and discharging currents from said node; and
   means responsive to said high and low reference voltages for adjusting said charging and discharging currents of said pulse forming means in accordance with the difference between said high and low reference voltages.

2. The circuit recited in claim 1 further comprising an output amplifier responsive to said pulsed output of said pulse forming means for providing driver pulses adapted to be fed to a device under test.

3. The circuit recited in claim 1 further comprising means for clamping said node to a range between upper and lower voltages in response to said high and low reference voltages.

4. The circuit recited in claim 1 wherein said adjusting means comprises a first transistor for providing charging current to said node and a second transistor for discharging current from said node.

5. The circuit recited in claim 4 wherein said adjusting means further comprises a difference amplifier fed by said high and low reference voltages, and means responsive to an output of said difference amplifier for producing a current in accordance with the difference between said high and low reference voltages, said first and second transistors having respective terminals connected to mirror current in response to said current producing means.

6. In an automatic test equipment system adapted to produce driver output pulses to be transmitted to a pin of a device under test wherein the output driver pulses are to have predetermined high and low voltage levels each corresponding to a respective high and low reference voltage, a pin driver circuit comprising:
   pulse forming means responsive to a data input signal for providing to an output node a pulsed output timed in accordance with said data input signal, said pulse forming means comprising means for providing charging current to and discharging current from said node;
   means responsive to said high and low reference voltages for clamping said node in a range between upper and lower voltages;
   a buffer circuit coupled to receive said pulsed output from said node;
   an output amplifier coupled to receive a buffered output from said buffer circuit and produce said output driver pulses having high and low voltage levels corresponding to said high and low reference voltage levels, respectively; and
   means for adjusting the magnitude of said charging and discharging currents of said pulse forming means in response to a difference between said high and low reference voltages to compensate slew rate and overshoot for devices under test operating at different logic levels.

7. The pin driver circuit recited in claim 6 wherein said adjusting means comprises a first transistor for providing said charging current to said node and a second transistor for discharging current from said node.

8. The pin driver circuit recited in claim 7 wherein said adjusting means further comprises mirror means for producing a current in accordance to the magnitudes of said high and low reference voltages.

9. The pin driver circuit recited in claim 8 wherein said adjusting means comprises means for mirroring the current of said first and second transistors to said mirror means.

10. The pin driver circuit recited in claim 9 wherein said mirror means comprises a difference amplifier fed by said high and low reference voltages, and a third transistor having a terminal coupled to an output of said difference amplifier.

11. In an automatic test system adapted to produce output driver pulses to be transmitted to a pin of a device under test wherein said system is adapted to produce driver pulses of selected high and low voltage levels to test devices operated at different logic levels, said selected high and low voltage levels being determined in response to selected high and low reference voltages, a pin driver circuit comprising:

pulse forming means responsive to a data input signal for providing to an output node a pulsed output timed in accordance with said data input signal, said pulse forming means comprising means for providing charging current to and discharging current from said node;

means responsive to selected high and low reference voltages for clamping said node between upper and lower voltages;

a buffer circuit coupled to receive said pulsed output from said node;

an output amplifier coupled to receive a buffered output from said buffer circuit and produce said output driver pulses having selected high and low voltage levels substantially in accordance with said selected high and low reference voltages; and means for optimizing slew rate and overshoot of output driver pulses having selected high and low voltage levels, said optimizing means comprising means for adjusting said charging and discharging currents flowing to and from said node.

12. The pin driver circuit recited in claim 11 wherein said adjusting means comprises a first transistor for providing said charging current to said node and a second transistor for discharging current from said node.

13. The pin driver circuit recited in claim 12 wherein said adjusting means further comprises mirror means for producing a current in accordance to the magnitudes of said selected high and low reference voltages.

14. The pin driver circuit recited in claim 13 wherein said adjusting means comprises means for mirroring the current of said first and second transistors to said mirror means.

15. The pin driver circuit recited in claim 14 wherein said mirror means comprises a difference amplifier fed by said selected high and low reference voltages, and a third transistor having a terminal coupled to an output of said difference amplifier.

16. A method of compensating test equipment adapted to provide driver pulses to a pin of a device under test to permit slew rates and overshoots to be optimized for a plurality of different types of test devices having different logic circuit types operating at different logic voltage levels, comprising the steps of:

providing charging currents to and discharging currents from a node to form pulses timed in accordance with an input data signal; and adjusting the magnitude of said charging and discharging currents in response to selected high and low reference voltages that determine the high and low voltage levels of said driver pulses to optimize slew rates and overshoots for said driver pulses.

17. The method recited in claim 16 further comprising a step of amplifying said pulses from said node to provide said driver pulses.

18. The method recited in claim 16 wherein said providing step comprises the steps of providing said charging current through a first transistor to said node, and discharging current from said node through a second transistor.

19. The method recited in claim 17 wherein said adjusting step comprises a step of producing through a third transistor a current corresponding to a difference between said selected high and low reference voltages.

20. The method recited in claim 17 wherein said adjusting step comprises a step of mirroring current of said first and second transistors to said third transistor.

* * * * *